(12) United States Patent
O'Keeffe et al.

(10) Patent No.: US 8,413,316 B2
(45) Date of Patent: Apr. 9, 2013

(54) METHOD FOR BONDING A WIRE CONDUCTOR LAID ON A SUBSTRATE

(75) Inventors: Seamus O'Keeffe, Furbo (IE); Brendan Morley, Claregalway (IE)

(73) Assignee: Hid Global Ireland Teoranta, County Galway (IE)

( * ) Notice: Subject to any disclaimer, the term of this patent is extended or adjusted under 35 U.S.C. 154(b) by 1058 days.

(21) Appl. No.: 12/212,882

(22) Filed: Sep. 18, 2008

(65) Prior Publication Data

US 2009/0100667 A1    Apr. 23, 2009

(30) Foreign Application Priority Data

Sep. 18, 2007  (EP) ..................... 07018301

(51) Int. Cl.
*H01P 11/00* (2006.01)
*H01Q 13/00* (2006.01)

(52) U.S. Cl.
USPC .............. 29/600; 29/606; 29/832; 257/690

(58) Field of Classification Search ........... 29/592.1, 29/595, 600, 604–606, 825, 832, 840, 860; 140/92.2; 257/679, 690; 361/737; 408/108
See application file for complete search history.

(56) References Cited

U.S. PATENT DOCUMENTS

| | | |
|---|---|---|
| 3,116,889 A | 1/1964 | Lasch, Jr. et al. |
| 3,384,283 A | 5/1968 | Mims |
| 3,674,602 A | 7/1972 | Keogh et al. |
| 3,674,914 A | 7/1972 | Burr |
| 3,917,148 A | 11/1975 | Runyon |
| 4,437,603 A | 3/1984 | Kobayashi et al. |
| 4,450,623 A | 5/1984 | Burr |
| 4,641,773 A | 2/1987 | Morino et al. |
| 4,642,321 A | 2/1987 | Schoenberg et al. |
| 4,693,778 A | 9/1987 | Swiggett et al. |
| 4,711,026 A | 12/1987 | Swiggett et al. |
| 4,791,285 A | 12/1988 | Ohki |
| 4,861,533 A | 8/1989 | Bertin et al. |

(Continued)

FOREIGN PATENT DOCUMENTS

| | | |
|---|---|---|
| AU | 720773 | 6/2000 |
| CA | 2348461 | 5/2000 |

(Continued)

OTHER PUBLICATIONS

AIT, Coil Manufacturing Technology, Sep. 1995, 6 pages.

(Continued)

*Primary Examiner* — Donghai D. Nguyen
(74) *Attorney, Agent, or Firm* — Sheridan Ross P.C.

(57) ABSTRACT

Method for bonding a wire conductor arranged on a preferably card-like substrate during the manufacture of a transponder unit having a wire coil and a chip module, comprising a first phase, wherein the coil is permanently joined with the substrate, and a second phase, wherein the wire conductor and the chip module are bonded, whereas in the first phase at least one of the end portions of the wire conductor intended for later bonding with the chip module is attached to the substrate with a free loop being formed, and that the loop thus formed is gripped in a second phase and a section of the loop is then bonded with a bonding area of the chip module and attached to it in an electronically conductive manner.

14 Claims, 15 Drawing Sheets

U.S. PATENT DOCUMENTS

| | | | |
|---|---|---|---|
| 4,912,143 A | 3/1990 | Ahn et al. |
| 5,008,619 A | 4/1991 | Keogh et al. |
| 5,041,826 A | 8/1991 | Milheiser |
| 5,094,907 A | 3/1992 | Yamamura et al. |
| 5,186,776 A | 2/1993 | Boyce et al. |
| 5,201,453 A | 4/1993 | Amador et al. |
| 5,281,855 A | 1/1994 | Hadden et al. |
| 5,288,008 A | 2/1994 | Haji et al. |
| 5,294,290 A | 3/1994 | Reeb |
| 5,365,657 A | 11/1994 | Brown et al. |
| 5,377,894 A | 1/1995 | Mizoguchi et al. |
| 5,393,001 A | 2/1995 | Gustafson |
| 5,531,390 A | 7/1996 | Gustafson |
| 5,535,043 A | 7/1996 | La Fiandra et al. |
| 5,606,488 A | 2/1997 | Gustafson |
| 5,649,352 A | 7/1997 | Gustafson |
| 5,770,807 A | 6/1998 | Finn et al. |
| 5,773,812 A | 6/1998 | Kreft |
| 5,809,633 A | 9/1998 | Mundigl et al. |
| 6,008,993 A | 12/1999 | Kreft |
| 6,023,837 A | 2/2000 | Finn |
| 6,055,720 A | 5/2000 | Finn et al. |
| 6,067,235 A | 5/2000 | Finn et al. |
| 6,088,230 A | 7/2000 | Finn et al. |
| 6,095,423 A | 8/2000 | Houdeau et al. |
| 6,102,275 A | 8/2000 | Hill et al. |
| 6,142,381 A | 11/2000 | Finn et al. |
| 6,152,348 A | 11/2000 | Finn et al. |
| 6,173,879 B1 | 1/2001 | Chiba |
| 6,190,942 B1 | 2/2001 | Wilm et al. |
| 6,233,818 B1 | 5/2001 | Finn et al. |
| 6,288,443 B1 | 9/2001 | Finn et al. |
| 6,295,720 B1 | 10/2001 | Finn et al. |
| 6,310,778 B1 | 10/2001 | Finn et al. |
| 6,313,566 B1 | 11/2001 | Cunningham et al. |
| 6,351,525 B1 | 2/2002 | Rodriguez |
| 6,471,878 B1 | 10/2002 | Greene et al. |
| 6,491,202 B1 | 12/2002 | Kyomasu et al. |
| 6,521,829 B2 | 2/2003 | Matsumura et al. |
| 6,604,686 B1 | 8/2003 | Taban |
| 6,619,530 B2 | 9/2003 | Ushiki et al. |
| 6,626,364 B2 | 9/2003 | Taban |
| 6,628,240 B2 | 9/2003 | Amadeo |
| 6,662,430 B2 | 12/2003 | Brady et al. |
| 6,698,089 B2 | 3/2004 | Finn et al. |
| 6,779,348 B2 | 8/2004 | Taban |
| 6,810,580 B2 | 11/2004 | Yamaguchi et al. |
| 6,870,497 B2 | 3/2005 | Kondo et al. |
| 7,032,311 B2 | 4/2006 | Razon |
| 7,059,535 B2 | 6/2006 | Rietzler |
| 7,105,915 B1 | 9/2006 | Finn et al. |
| 7,229,022 B2 | 6/2007 | Rietzler |
| 7,546,671 B2 * | 6/2009 | Finn ............... 29/606 |
| 2002/0020903 A1 | 2/2002 | Kreft et al. |
| 2002/0060239 A1 | 5/2002 | Or et al. |
| 2003/0000070 A1 | 1/2003 | Lee et al. |
| 2003/0024103 A1 | 2/2003 | Kiguchi et al. |
| 2003/0207499 A1 | 11/2003 | DiStefano et al. |
| 2004/0206799 A1 | 10/2004 | Wong |
| 2006/0071084 A1 | 4/2006 | Detig et al. |
| 2006/0208066 A1 | 9/2006 | Finn et al. |
| 2008/0072423 A1 | 3/2008 | Finn et al. |
| 2008/0073800 A1 | 3/2008 | Finn |
| 2008/0150817 A1 | 6/2008 | Carre et al. |
| 2008/0155822 A1 | 7/2008 | Finn |
| 2008/0179404 A1 | 7/2008 | Finn |
| 2008/0183640 A1 | 7/2008 | Shalen |
| 2008/0283615 A1 | 11/2008 | Finn |
| 2009/0033585 A1 | 2/2009 | Lang |
| 2010/0141453 A1 | 6/2010 | Finn |

FOREIGN PATENT DOCUMENTS

| | | |
|---|---|---|
| CA | 2555034 | 9/2005 |
| CN | 1210602 | 3/1999 |
| DE | 2111396 | 9/1971 |
| DE | 3247344 | 7/1983 |
| DE | 3622246 | 1/1987 |
| DE | 3624630 | 2/1987 |
| DE | 3805584 | 8/1989 |
| DE | 3937988 | 5/1990 |
| DE | 4205084 | 9/1993 |
| DE | 4325334 | 12/1994 |
| DE | 4329708 | 3/1995 |
| DE | 4332055 | 3/1995 |
| DE | 4408124 | 9/1995 |
| DE | 4410732 | 10/1995 |
| DE | 4417625 | 11/1995 |
| DE | 4431605 | 3/1996 |
| DE | 4446289 | 6/1996 |
| DE | 19509999 | 9/1996 |
| DE | 19525933 | 1/1997 |
| DE | 19534480 | 3/1997 |
| DE | 19604840 | 3/1997 |
| DE | 19541039 | 5/1997 |
| DE | 19541996 | 5/1997 |
| DE | 19619771 | 8/1997 |
| DE | 19610507 | 9/1997 |
| DE | 19616424 | 10/1997 |
| DE | 19654902 | 10/1997 |
| DE | 19620242 | 11/1997 |
| DE | 19713634 | 11/1997 |
| DE | 19634473 | 1/1998 |
| DE | 19634661 | 3/1998 |
| DE | 19646717 | 5/1998 |
| DE | 19651566 | 6/1998 |
| DE | 59503553 | 10/1998 |
| DE | 19716912 | 11/1998 |
| DE | 19741984 | 6/1999 |
| DE | 19751043 | 6/1999 |
| DE | 59602458 | 8/1999 |
| DE | 59602495 | 8/1999 |
| DE | 19822383 | 12/1999 |
| DE | 59507294 | 12/1999 |
| DE | 19850353 | 3/2000 |
| DE | 19840220 | 4/2000 |
| DE | 59701709 | 6/2000 |
| DE | 19903784 | 8/2000 |
| DE | 19920593 | 11/2000 |
| DE | 59508993 | 3/2001 |
| DE | 19946254 | 4/2001 |
| DE | 19934789 | 5/2001 |
| DE | 10009456 | 9/2001 |
| DE | 59607684 | 10/2001 |
| DE | 59707230 | 6/2002 |
| DE | 59610675 | 9/2003 |
| DE | 59711861 | 9/2004 |
| DE | 102004010013 | 9/2004 |
| DE | 102004011929 | 9/2005 |
| DE | 202005016382 | 2/2006 |
| DE | 102004043747 | 3/2006 |
| DE | 102004045896 | 3/2006 |
| EP | 0133820 | 3/1985 |
| EP | 0212238 | 3/1987 |
| EP | 0217019 | 4/1987 |
| EP | 0227002 | 7/1987 |
| EP | 0276928 | 8/1988 |
| EP | 0481776 | 4/1992 |
| EP | 0593966 | 4/1994 |
| EP | 0692770 | 1/1996 |
| EP | 0753180 | 1/1997 |
| EP | 0759830 | 3/1997 |
| EP | 0804799 | 11/1997 |
| EP | 0815475 | 1/1998 |
| EP | 0839360 | 5/1998 |
| EP | 0852040 | 7/1998 |
| EP | 0859681 | 8/1998 |
| EP | 0880754 | 12/1998 |
| EP | 0922289 | 6/1999 |
| EP | 0944922 | 9/1999 |
| EP | 0976099 | 2/2000 |
| EP | 1125248 | 8/2001 |
| EP | 1177579 | 2/2002 |
| GB | 1352557 | 5/1974 |
| GB | 1593235 | 7/1981 |
| GB | 2180175 | 3/1987 |
| GB | 2180408 | 3/1987 |

| | | |
|---|---|---|
| JP | 062008313 | 1/1987 |
| JP | 1264234 | 10/1989 |
| JP | 06351194 | 12/1994 |
| JP | 9507727 | 8/1997 |
| JP | 9510834 | 10/1997 |
| JP | 11-034560 | 2/1999 |
| JP | 11502334 | 2/1999 |
| JP | 11-328346 | 11/1999 |
| JP | 11514933 | 12/1999 |
| JP | 11515120 | 12/1999 |
| JP | 2000-502477 | 2/2000 |
| JP | 2000-148949 | 5/2000 |
| JP | 2003-303325 | 10/2003 |
| JP | 2005-136901 | 5/2005 |
| WO | WO 91/16718 | 10/1991 |
| WO | WO 93/20537 | 10/1993 |
| WO | WO 94/28562 | 12/1994 |
| WO | 9503685 | 2/1995 |
| WO | WO 95/26538 | 10/1995 |
| WO | WO 95/32073 | 11/1995 |
| WO | WO 96/07984 | 3/1996 |
| WO | WO 96/13793 | 5/1996 |
| WO | WO 96/22608 | 7/1996 |
| WO | WO 96/29618 | 9/1996 |
| WO | WO 97/04415 | 2/1997 |
| WO | WO 97/11437 | 3/1997 |
| WO | WO 97/17191 | 5/1997 |
| WO | WO 97/30418 | 8/1997 |
| WO | WO 97/35273 | 9/1997 |
| WO | WO 98/02848 | 1/1998 |
| WO | WO 98/09305 | 3/1998 |
| WO | WO 98/26453 | 6/1998 |
| WO | WO 00/26855 | 5/2000 |
| WO | WO 00/68994 | 11/2000 |
| WO | WO 01/08089 | 2/2001 |
| WO | WO 02/077918 | 10/2002 |
| WO | 2004/006178 | 1/2004 |

OTHER PUBLICATIONS

AIT, CoilPro Wiring Systems, CoilPro 2000, date unknown, 1 page.
AIT, Embedded Wire Technology, date unknown, 1 page.
AIT, RFID Embedded Wire Technology, date unknown, 1 page.
International Search Report for International (PCT) Application No. PCT/IB2007/004658, mailed Mar. 4, 2009.
Written Opinion for International (PCT) Application No. PCT/IB2007/004658, mailed Mar. 4, 2009.
International Preliminary Report on Patentability for International (PCT) Application No. PCT/IB2007/004658, mailed Apr. 9, 2009.
International Search Report for International (PCT) Patent Application No. PCT/IB2007/004589, mailed Nov. 28, 2008.
Written Opinion for International (PCT) Patent Application No. PCT/IB2007/004589, mailed Nov. 28, 2008.
International Preliminary Report on Patentability for International (PCT) Patent Application No. PCT/IB2007/004589, mailed Apr. 9, 2009.
Official Action for European Patent Application No. 07875200.3, dated Nov. 2, 2009.
Official Action for European Patent Application No. 07875200.3, dated Oct. 29, 2010.
Official Action for European Patent Application No. 07872847.4, dated Oct. 29, 2010.
Official Action (Restriction Requirement) for U.S. Appl. No. 11/860,162, mailed Jun. 4, 2010.
Official Action for U.S. Appl. No. 11/860,210, mailed Sep. 23, 2010.
Notice of Allowance for U.S. Appl. No. 11/860,210, mailed Mar. 3, 2011.
Official Action (Restriction Requirement) for U.S. Appl. No. 11/860,210, mailed Dec. 9, 2010.
Restriction Requirement for U.S. Appl. No. 11/860,210, mailed Mar. 14, 2011.
Official Action for U.S. Appl. No. 11/860,210, mailed May 25, 2011.
Official Action for European Patent Application No. 07875200.3, dated May 16, 2011.
Official Action for Australia Patent Application No. 2007349611, dated Jul. 25, 2011 2 pages.
English translation of Official Action for China Patent Application No. 200780040534.5, issued Jul. 26, 2011 3 pages.
English Translation of Official Action for China Patent Application No. 200780041337.5, dated Aug. 31, 2011 3 pages.
English Translation of Official Action for Japan Patent Application No. 2009-529801, drafted Sep. 9, 2011 3 pages.
Official Action for European Patent Application No. 07872847.4, dated Sep. 15, 2011 4 pages.
Examiner's Answer to Appeal Brief for U.S. Appl. No. 11/718,512, mailed Oct. 17, 2011 11 pages.
European Search Report and Written Opinion, Reference No. E87054 EP (GS/, Application No. 07018301.7, Aug. 2, 2008; 6 pgs.
Communication of a Notice of Opposition for European Patent Application No. 07820048.2, dated Oct. 17, 2011, 22 pages.
Communication of Notices of Opposition (R. 79(1) EPC) for European Patent Application No. 07820048.2, dated Nov. 24, 2011, 1 page.
Notice of Acceptance for Australia Patent Application No. 2007349611, dated Jan. 25, 2012 3 pages.
Official Action for U.S. Appl. No. 11/860,210, mailed Dec. 7, 2011.
Official Action with English Translation for Japan Patent Application No. 2009-530971, mailed Sep. 4, 2012 4 pages.
Notice of Allowance for Japan Patent Application No. 2009-530971, dated Dec. 4, 2012 3 pages.
Notice of Allowance with English Translation for China Patent Application No. 200780041337.5, dated Sep. 27, 2012 4 pages.
Official Action with English translation for China Patent Application No. 200780041337.5, dated May 2, 2012 13 pages.
Official Action with English Translation for China Patent Application No. 200780040534.5, dated May 2, 2012 8 pages.
Notice of Allowance for U.S. Appl. No. 11/860,210, mailed Jul. 9, 2012 9 pages.
Official Action with English translation for China Patent Application No. 200780040534.5, dated Nov. 28, 2012, 8 pages.

* cited by examiner

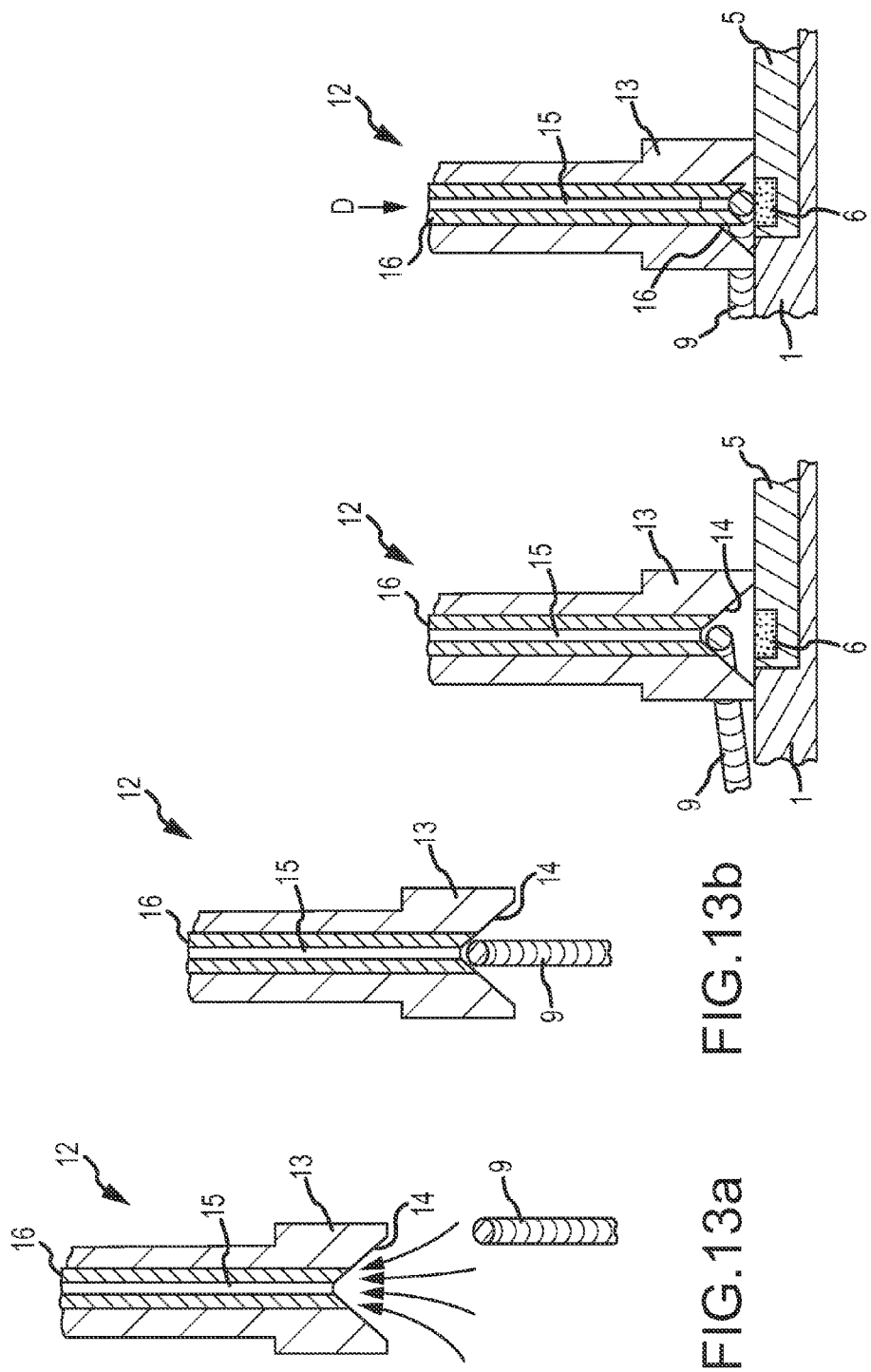

METHOD FOR BONDING A WIRE CONDUCTOR LAID ON A SUBSTRATE

FIELD OF THE INVENTION

The invention relates to a method for bonding a wire conductor disposed on a substrate, in particular a wire conductor laid directly on a substrate during the manufacture of a transponder unit.

BACKGROUND OF THE INVENTION

Essential elements of every transponder unit are the wire coil attached on a substrate, such as a chip card, and the electronic circuit which, is also attached on the chip card. The latter is called a chip. For the most part, in modern manufacturing methods the wire coil is not first wound as an air-core coil and then baked together with the substrate, but that the wire is directly laid onto the substrate to form a wire coil, for example, by being embedded into the plastic of the substrate by ultrasonic welding. The German Published Patent Application 44 10 732 A1 describes the details of such a wire laying method.

In the manufacture of such a transponder unit, bonding the ends of the coils with the terminal areas of the chip still creates a special problem. This is due, in particular, to the very small dimensions of the components that are to be connected with each other. A chip unit's terminal areas, which mostly or substantially are formed to have a square shape, as a rule have a relatively small side length. Particularly in the low-frequency range, a copper wire, the diameter of which for the most part is in the range of 50 μm, is usually used as the coil wire. In view of these dimensions it becomes clear that some care must be taken so as to really align the wire sufficiently with the terminal areas of the chip when connecting them.

It has already been proposed that one and the same tool be used for laying the wire onto the substrate and for bonding the wire with the chip, compare DE 43 25 334 A1. If there is an intention of using one and the same tool both for laying the wire onto the substrate and connecting the wire to the terminal areas of the chip unit in one process step, attention must not only be paid to the tact that the wire must be guided very precisely at said tool in order to ensure that the same position of the wire is very precisely allocated to one certain position of the tool. There is, rather, the additional problem that the means for connecting the wire with the substrate and the additional means for connecting or welding the wire must be integrated into the tool in a very small space indeed. This is necessary so that the position at which the wire is to be laid onto the substrate or connected with the chip can be set by the controlling device or controller with sufficient precision both during laying as well as during connecting. This integration entails a considerable effort with regard to the tools and, furthermore, does not allow for an optimal operating speed. Because in such an integration it is not possible to carry out the laying of the wire onto the substrate and the bonding of wire with the terminal areas of the chip independently from one another, i.e., it is not possible to proceed with laying the wire whilst the wire is connected with the first terminal area of the chip.

A totally different approach is proposed by EP 0 880 754 B1. In order to reduce the number of working steps, this printed publication teaches not to pre-mount the chip or "chip unit" onto a bonding substrate with enlarged terminal areas, but to bond them directly. For this purpose, this approach provides a first step within whose context the wire is first guided over the terminal area on the chip unit and fixed on the substrate relative to the terminal area of the chip unit. An exactly defined orientation of the wire relative to the terminal area on the chip unit is achieved with this first step. It is not until then that the connection of the wire with the terminal area is carried out in a second step.

In practical application, these two steps are carried out in the following manner: the wire laying device connects the wire with the substrate, then draws the wire over the first terminal area of the chip unit in order to then connect the wire with the substrate behind the terminal area of the chip unit again, thus to lay the coil on the substrate. Once the coil has been laid completely and the wire laying device has arrived at the second terminal area of the chip unit, it draws the chip over the second terminal area and, behind the second terminal area, connects it with the substrate again for a certain distance.

This solution works actually works rather well in practical use. It allows for the laying of the wire onto the substrate and the connecting of the wire with the terminal areas located immediately on the chip unit to be carried out in two different, spatially separate work stations—the substrate with the finished wound coil and the wire drawn over the terminal areas of the chip unit can be taken from the first working station and transferred to a second working station. There, the wire strung over the terminal areas is approached by a tool and connected by it with the terminal areas. However, problems particularly occur in the case where the chip unit that is only loosely inserted in the window of the card unit is displaced relative to the card substrate for whatever reason during the further transport.

In this context, the following should be known: It is often expedient for the card substrate and the chip module to run through various processing stations of a manufacturing machine before they finally become the finished RFID card. For example, the window is punched into the card substrate in a first processing station. The card substrate thus processed is then conveyed on to a second processing station. In this station, the chip module is inserted into said window, without being connected with the card substrate, of course. This ensemble of card substrate and the chip module is conveyed on to a third processing station. At this station, the wire is laid on the substrate. Finally, the ensemble is conveyed into a fourth processing station in which the wire is connected in an electrically conductive manner with the bonding areas of the chip or of the chip module provided for this purpose. It is only in a subsequent processing station, which in most cases is the fifth, that the card substrate and the chip or chip module are firmly connected with each other by laminating them with suitable cover layers.

As long as the card substrate and the chip or chip module are not even connected by means of the wire terminal, considerable displacements in the position of the chip or chip module relative to the card substrate may occur, because each of the above-mentioned transport processes from one processing station to another can lead to a displacement in position. Displacements in position may also be caused by the card substrate heating up more than only to an inconsiderable extent during the laying of the wire, for heat energy is applied to the card substrate in a considerable extent in particular during the laying of the wire by means of ultrasonic friction welding.

As stated above, these almost unpredictable shifts in position may cause problems if the goal is to hit the terminal areas of the chip or the chip unit, too, with the wire in order to establish an electrically conductive connection.

As a consequence, the wire then is not drawn over the terminal area concerned of the chip or chip module at all, or only with an insufficient degree of covering. Thus, a faulty bonding between the wire and the terminal area of the chip or chip module may possibly occur in the second station.

In view of all this, it is the object of the invention to provide a laying method, wherein the laying of the wire onto the substrate can proceed independently from the connection of the wire with the chip module and which allows the compensation particularly of such tolerances as may occur by unintended relative movement between the card substrate and the chip module.

SUMMARY OF THE INVENTION

This object is solved with the features of the characterizing portion of Claim 1. Two phases are provided according to embodiments of the invention. In the first phase, which serves the purpose of laying the wire onto the substrate, at least one of the end portions of the wire conductor provided for later bonding with the chip module is attached to the substrate while a loop is formed. The loop thus formed is gripped in a second phase, which serves the purpose of bonding the wire conductor with the chip module. After gripping, the end portion of the wire conductor is bonded with a bonding surface of the chip module and permanently connected with it in an electrically conductive manner. The portion of the wire conductor lying between a free end of the wire conductor that is created by the separation of the wire conductor from the wire supply, and the actual coil is considered to be the end portion—regardless of whether it is the beginning or the end of the wire conductor with respect to the production sequence. The term loop here defines a portion of the wire conductor, which lies between two portions of the wire conductor attached to the substrate, which, however, is not itself attached to the substrate and is more than only insubstantially longer than the shortest connecting line between the two sections of wire conductor attached to the substrate. Namely such that the loop-forming section has a clear curvature or clear deviation from the straight line. It is thus made possible that at least a partial portion of the loop-forming portion can be displaced more than only insubstantially relative to the substrate so as to subsequently bring the partial portion concerned into alignment with the terminal area of the chip module. As a rule, the loop will protrude from the substrate surface in order to be capable of being gripped by a gripping organ of whatever kind without that organ gliding along the substrate surface.

As a rule, the method according to the invention makes use of a camera- or sensor-based capture of the exact position of the terminal areas concerned of the chip module. In this manner, such deviations from position may be compensated, inter alia, which result from the chip module having shifted relative to the card substrate during transport from the wire laying station to the bonding station.

The term chip module used in the claim preferably denotes a chip that realizes a circuit and has been brought onto a carrier substrate. The chip is located under a protective cover ("glop top") on the carrier substrate. The bonding surfaces of the chip are connected in an electrically conductive manner with the bonding surfaces, which in part are exposed towards the outside, by means of thin wires that run inside of the protective cover. The latter bonding surfaces are connected with the wire conductor forming the coil.

Further advantages and optional embodiments become apparent from the following description of the exemplary embodiments of the invention.

BRIEF DESCRIPTION OF THE DRAWINGS

FIGS. 13a to e show by enlarged views or cross sectional views of a wire connecting head, how it grips the wire conductor, guides it towards the terminal area of the chip and presses it against the terminal area in order to then connect the wire conductor with it by ultrasonic bonding.

DETAILED DESCRIPTION

The transponder unit T shown in FIG. 1 later is a part of an ID card or passport, after a cover layer which is not shown here has been laminated on it. It makes possible the wireless transmission of personal data or biometric data stored on the chip module, among them possibly also image data with a photograph or a fingerprint of the rightful owner of the document.

The transponder unit T comprises of a substrate 1 which in itself is usually manufactured from a suitable plastic. The substrate is equipped with a miniaturized electronic circuit in the form of a chip module 5. This is usually done by a window being punched into the substrate and the chip module being inserted into the window—only loosely, at first. The actual, really firm connection between the chip module and the substrate is done at the end, when cover layers are laminated onto the substrate and the chip module.

A wire conductor, which most of the time consists of copper, is laid onto the substrate, here in the form of a partial embedding of the wire conductor into the substrate. This embedding is preferably carried out by means of ultrasound, e.g. in the manner described in the German application 44 10 732 A1. As far as the disclosure of said application relates to the laying of the wire conductor on the substrate, the contents of the '732 application are hereby incorporated herein by reference. Alternatively, other wire laying techniques such as welding and/or gluing of the wire conductor to the substrate 1 can be used for carrying out the method according to the invention.

Figure 4:
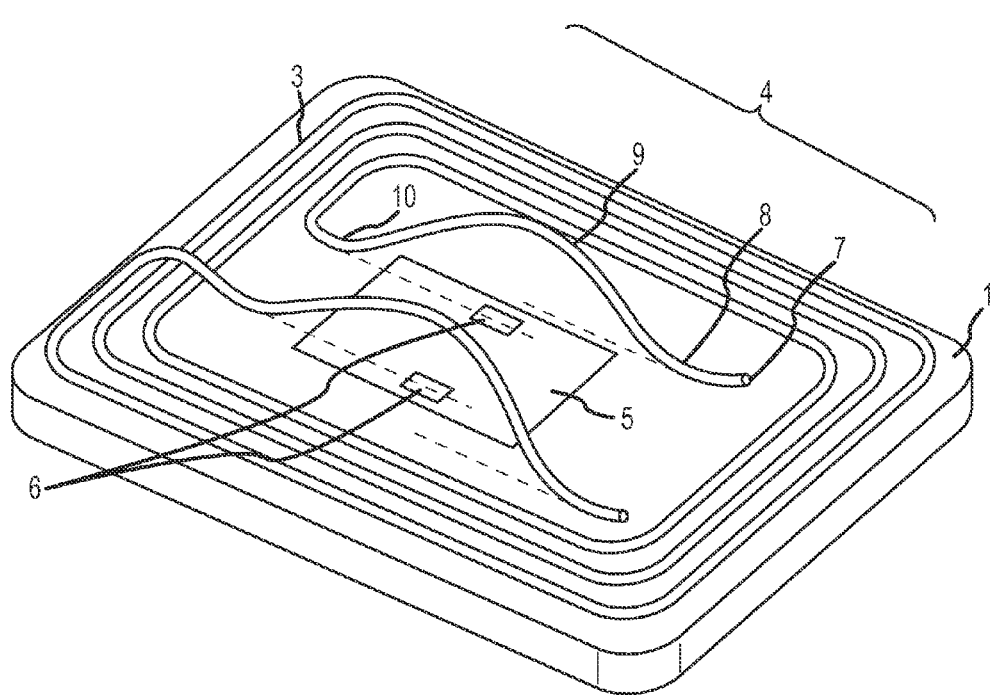
Figure 4A:
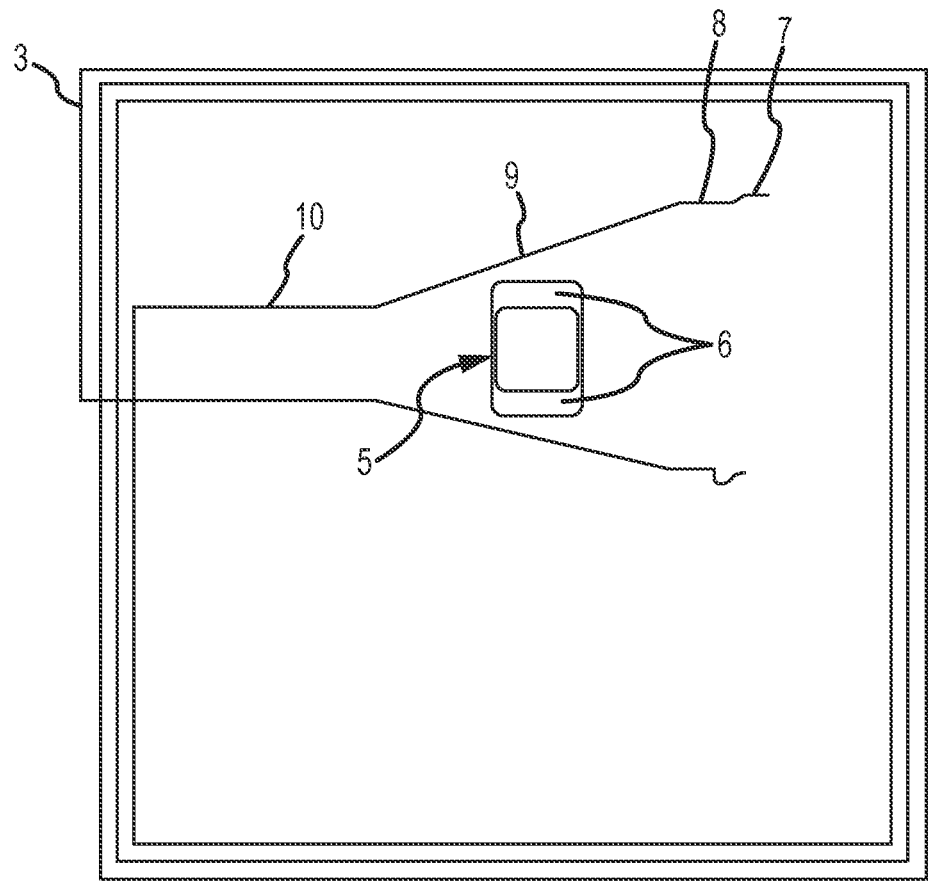

As can best be seen from FIGS. 4 and 4a, the wire conductor (which in this Figure is not provided with its own reference numeral) is laid on the substrate 1 so that it forms functionally different sections, namely the actual coil 3 and the end portions 4 that respectively lie between the coil 3 and the free end 7 of the wire conductor. The coil can consist of various turns. That only three turns are shown here is solely due to the attempt at a simple presentation. These end portions 4 can in turn be divided into three sub-portions—the first subportion is formed by the outer part 8 of the end portion, which is connected with the substrate and which, in many cases, is torn off during the connection of the wire conductor with the terminal areas of the chip module by the rest of the wire conductor. The second sub-portion is formed by the approximately U-shaped loop 9 of the end portion, which, even in the completed state (as long no cover laminate has been laminated thereon), is not connected with the substrate 1, but only with the chip 5. The third of said sub-portions is formed by the inner part 10 of the end portion leading from the chip 5 to the actual coil 3. Here, however, this inner part 10 of the end portion can be omitted in other embodiments in which the chip lies directly under the coil turns.

Figure 1:
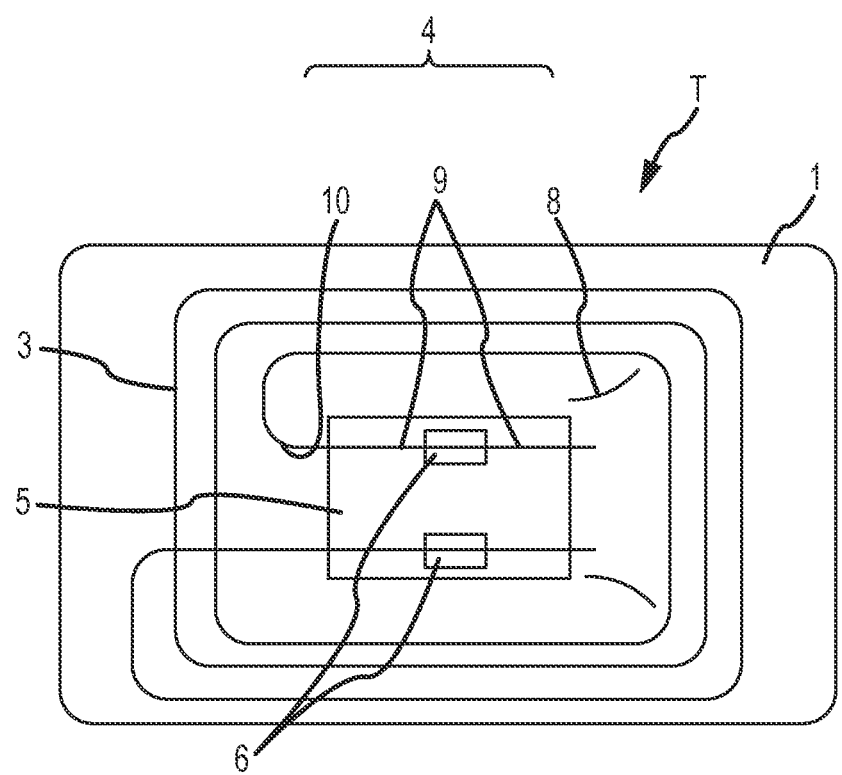
FIG. 1 shows a finished transponder unit that was produced with a first embodiment of the method according to the invention and that has been given its characteristic shape by it.

In a finished transponder unit as is shown in FIG. 1, the loops have just been pulled straight—in the finished product, the wire sections that originally formed the loops lie flat on the substrate 1 to a large extent and span over the terminal areas 6 of the chip module with which they are connected in an electrically conductive manner.

The finished transponder unit T shown by FIG. 1 has been manufactured in two phases.

In the first phase, the wire conductor was completely laid onto the substrate 1. In the second phase, the completely laid wire conductor is connected with the terminal areas 6 of the chip.

Figure 2:
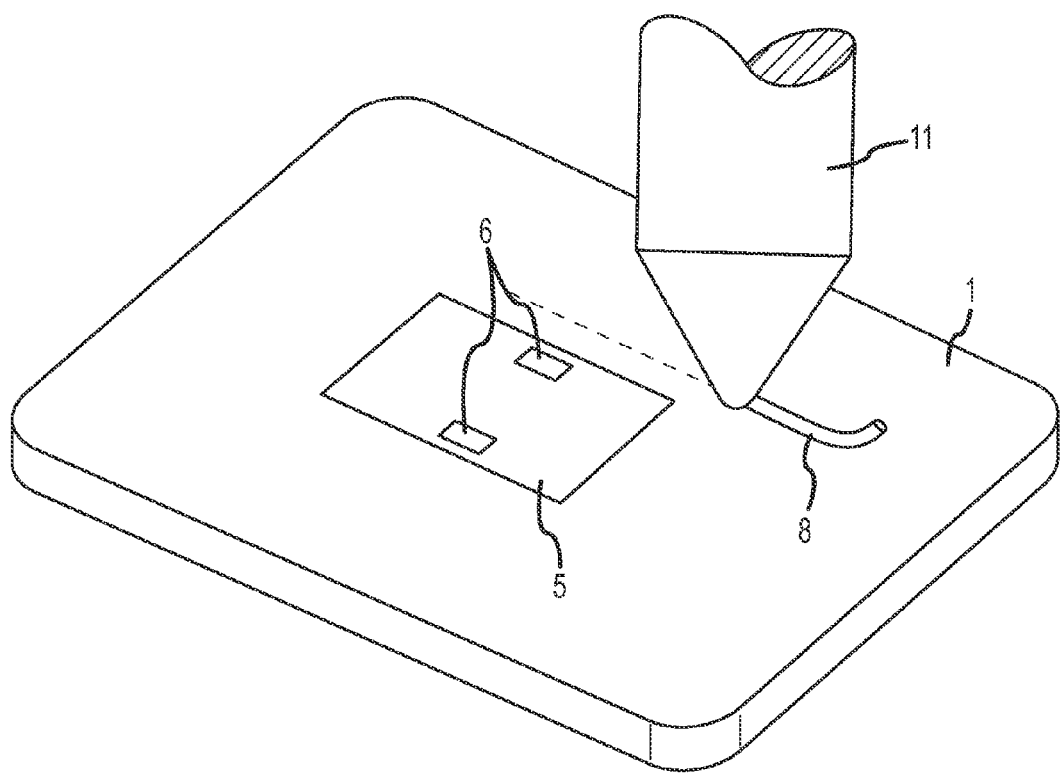
FIGS. 2 to 4a show different stages within the first phase in the production of the embodiment shown in FIG. 1.
Figure 3:
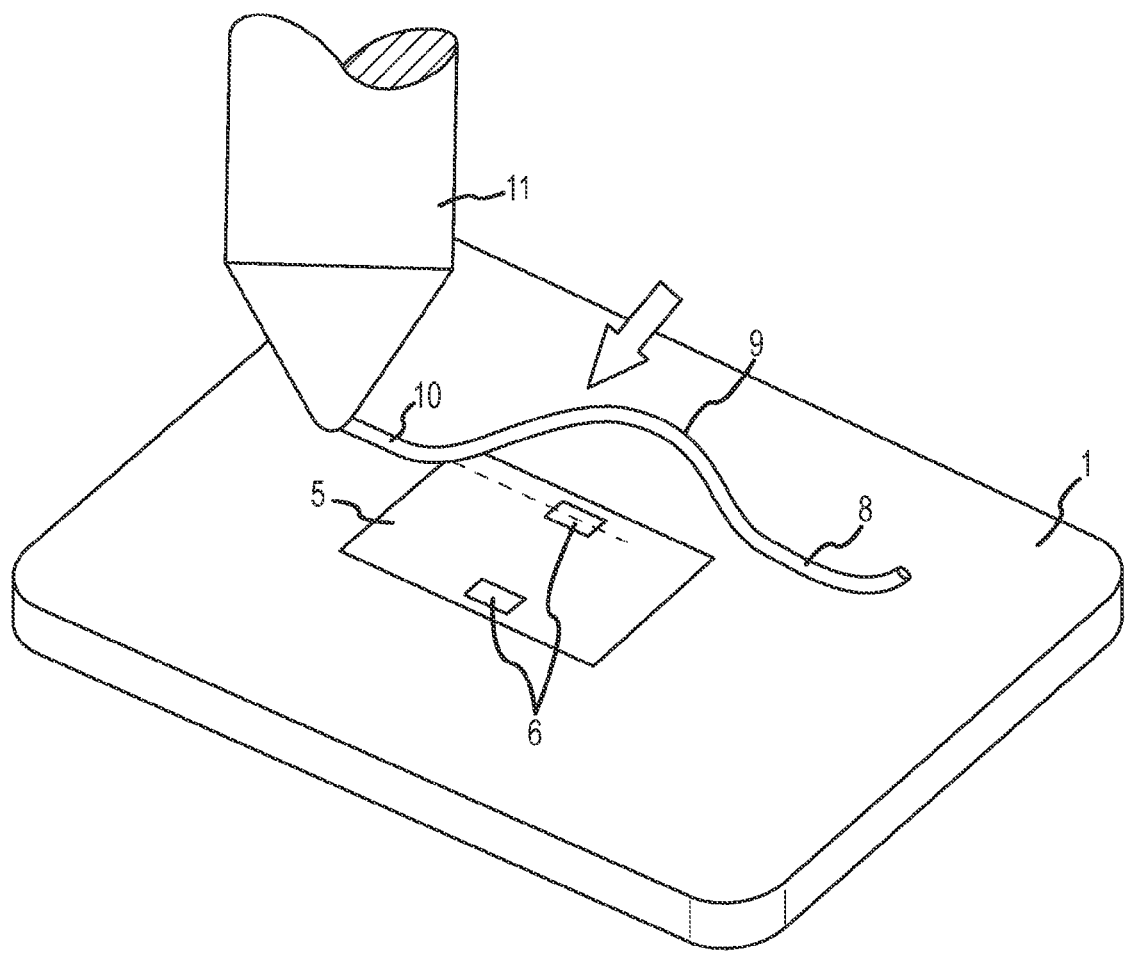

The details of said first phase are illustrated by the FIGS. 2 to 4.

The prepared substrate 1 which is already combined with the chip 5 is inserted in an exactly defined position into the wire laying station of a production line consisting of several subsequently arranged different processing stations.

First, the outer part 8 of the first end portion 4 of the wire conductor is attached on the hitherto virgin substrate 1 by means of a suitable wire laying head 11, i.e., it is at least loosely tacked onto the substrate 1, or even finally connected with it (FIG. 2). In the process, attention is preferably paid to the outer part 8 being attached on the substrate in a position relative to the chip module in which the imagined extension of the longitudinal axis of the outer part 8 does not intersect the corresponding terminal area 6 of the chip module 5, and also does not go beyond it (compare the dotted line in FIG. 2).

Then the wire laying head 11, which continues to move, is lifted off the substrate 1 and subsequently positioned against the substrate 1 again. Thus, the wire connector forms the loop 9, which at first is approximately U-shaped, at the first end portion of the wire conductor (FIG. 3).

In the process, during the above described "lifting-off phase" the wire laying head is moved in such a manner for forming the actual loop 9 (e.g., in the direction of the black arrow drawn in FIG. 3), that the imagined extension of the longitudinal axis of the inner part 10 of the end portion intersects the corresponding terminal area 6 on the chip module or goes beyond the terminal area 6, compare the dotted line shown in FIGS. 3 and 4. However, the latter is not obligatory, for a corresponding alignment can also be carried out later by the gripper 19a concerned, which is to be explained shortly, providing for a comparable alignment of the portion of loop 9 following the inner part 10.

As a whole, the described method leads to the loop 9, which at first is approximately U-shaped, being formed at the first end portion of the wire conductor (FIG. 3), which does not yet go beyond the terminal areas 6 but runs in an oblique direction laterally next to the terminal areas 6. Here the loop 9 protrudes from the surface of the substrate in an angle of about 90 degrees (+/−10 degrees). It can therefore be gripped easily later on.

Subsequent to said inner part 10, the wire laying head 11 lays the wire conductor on the substrate 1 in the form of a coil 3. The way of proceeding just described for the first end portion 4 of the wire conductor is repeated analogously at the second end portion of the wire conductor. Thus, after completion of the first phase, i.e. after completion of the laying of the wire, the work piece (i.e., the unfinished transponder unit) has the structure shown by FIG. 4.

In order to achieve the fastest possible production speed, the work piece is now transferred from the wire laying station to the wire connecting station, that is, it is transported further along the production line. At the same time, the wire laying station is again loaded with a new virgin substrate 1. Laying and connecting the wire is thus carried out synchronously on two successive substrates or sets of substrates.

Figure 5:
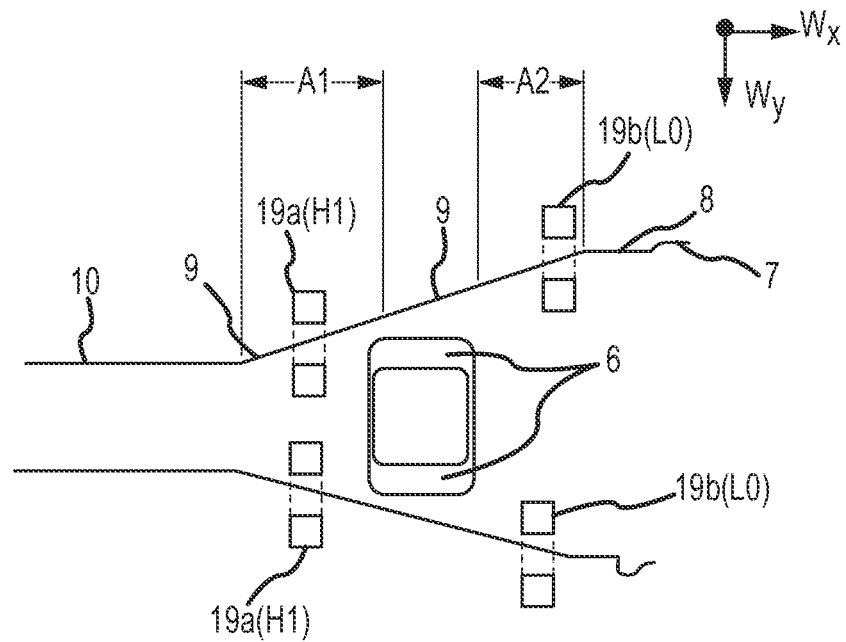
FIG. 5 shows how, in the beginning of the second production phase of the embodiment shown in FIG. 1, the grippers are guided towards the loops.

The wire connecting station is provided with a digital image processing system (not illustrated in the drawing). The image processing system captures the current position of at least the chip module 5. This can be recognized automatically rather precisely since the chip module 5 has a simple contour that can be easily captured by a digital image processing system. With regard to the current position of the loops 9, in contrast, a fraction of a millimeter is often not of importance since the grippers 19a, 19b, which have to be described in more detail shortly, carry out a relatively large opening and closing movement, anyway, and in the process grip ("collect") the loops 9 rather reliably even if the current position of the loop is not known with 100 percent accuracy. With the help of this image processing system, a specially formed set of grippers consisting of a gripper 19a, hereinafter referred to gripper HI, which has a strong clamping force, and a gripper 19b, hereinafter referred to gripper LO, which has a low clamping force (FIG. 5), is brought close. As is apparent from FIG. 5, the gripper HI grips a portion of the loop 9 that lies in the portion A1 between the chip module 5 and the inner part of the end portion 10 (that is, in the portion A1). The gripper LO in contrast grips a section of the loop lying between the chip module 5 and the outer part 8 of the end portion (that is, in portion A2).

The clamping force, of the gripper LO has been selected such that it is just low enough that, when tension in the direction of its longitudinal direction occurs, the wire conductor first begins to slip through between the clamping jaws of the gripper LO before it is torn off in any place. In contrast, the clamping force of the gripper HI, as a rule, is selected such that the two clamping jaws of the gripper hold the wire conductor between each other such that no slipping through of the wire conductor can occur, or at least no slipping through worth mentioning.

As soon as the set of grippers 19a, 19b has gripped the loop concerned securely, the respective gripper LO, by the movement in the direction of one or both of the arrows $W_x$, $W_y$, (and possibly also in the vertical direction), is moved into a position in which the wire conductor formerly forming the loop 9 has been pulled straight, and in which it lies over the terminal area 6 of the chip module intended for it, when seen along the vertical direction. In order to accomplish this, the respective gripper HI is also moved, if necessary, in particular in the direction of the arrow $W_y$.

Figure 7:
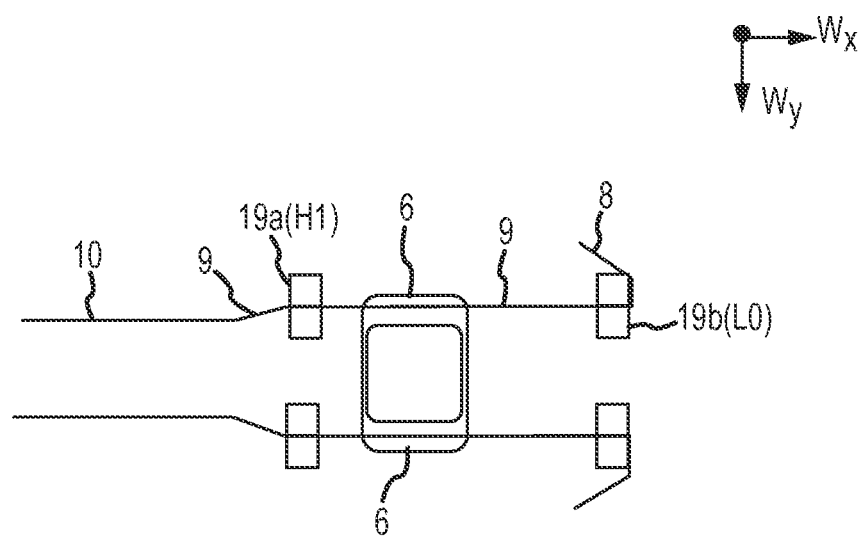
FIG. 7 shows the grippers shown by FIGS. 5 and 6 after conveying or positioning.
Figure 8:
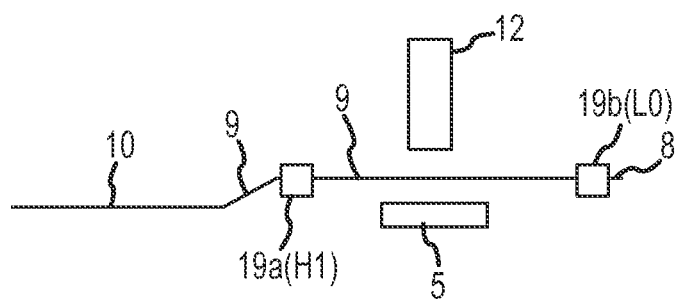
FIG. 8 to 10 show the operation of the wire connecting head.
Figure 9:
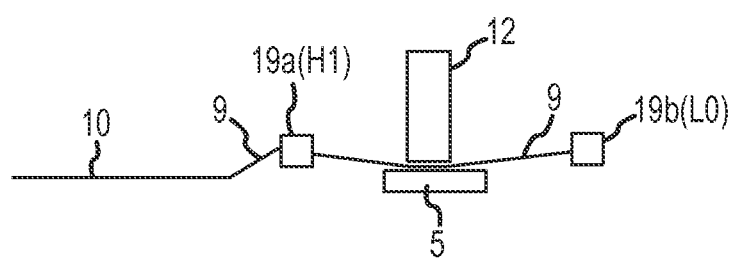
Figure 10:
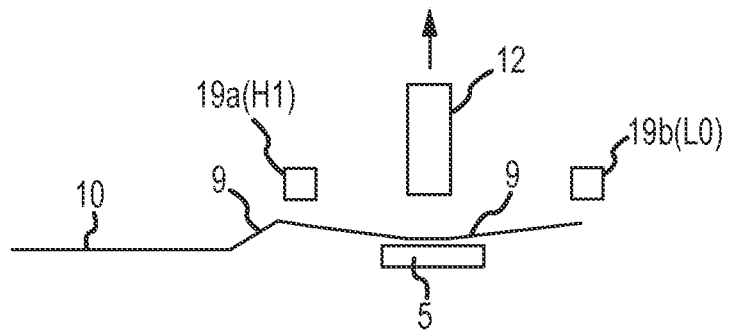

The result of this additional process step looks as shown by FIGS. 7 and 8.

Figure 6:
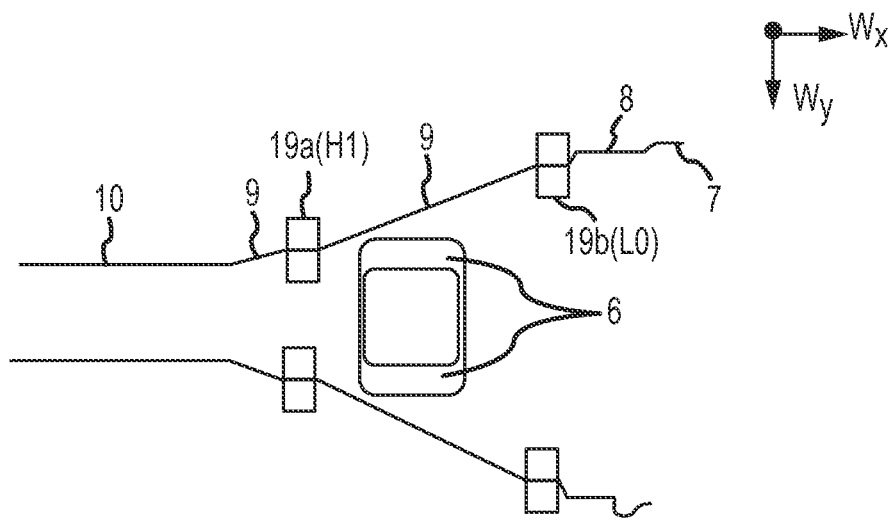
FIG. 6 shows the grippers shown by FIG. 5 during closing.

Two effects can be used for the "pulling straight" of loop 9 that was already mentioned. If one compares FIGS. 6 and 7, it can be recognized that a tensile stress occurs rather soon between the outer part 8 of the end portion fastened onto the substrate 1 and the section of the loop 9 located between the outer part 8 and the gripper LO, as soon as the gripper LO moves in the direction of the arrow $W_y$ and/or in the vertical direction. This tensile stress leads to a part of the section of the loop 9, which is at first located between the grippers HI and LO, being pulled through the two clamping jaws of the gripper LO towards the outside, whereby the loop 9 is pulled straight. Here, the clamping jaws of the gripper LO are preferably profiled such that the wire conductor can only be pulled out in a certain defined direction towards the outside, preferably in the horizontal direction. As soon as the section of the loop 9 which is the last to be located between the grippers is pulled taut, the stress of the section of loop that is located between the outer part 8 and the gripper LO becomes so great that the wire conductor tears off in this section.

Secondarily, or superposed on this, the grippers HI and LO can additionally also be driven apart in the direction of the arrow $W_x$ in order to pull straight the section of the loop located between them.

Here, another sensible option is to provide a sharp tearing edge or corner on the corner of the clamping jaw of the gripper LO over which the wire conductor is guided, which specifically causes the wire conductor to tear off as soon as the wire conductor is pulled taut over this tearing edge or corner (not especially shown in the drawing).

As soon as the wire conductor is positioned over the terminal area 6 of the chip module 5 allocated to it, in the way illustrated in FIG. 8, the wire connecting head 12 is brought close. It grips the wire conductor, carries it along further in the direction of the terminal area 6, if necessary (which is possible without provoking the wire conductor to tear off in particular because a piece of wire conductor can be drawn through the clamping jaws of the gripper LO), an finally presses it against it. The wire conductor is now connected in an electrically conducting manner with the terminal area 6 of the chip module, usually bonding, but possibly also by welding, in particular ultrasonic friction welding, soldering or the like.

The grippers now let go of the wire conductor and are retracted, as is the wire connecting head 12. The chip cards which are now finished at this station are conveyed onward, new chip cards follow. The cycle can begin anew.

The process step for connecting the wire conductor with the terminal areas of the chip module described up to here has proved itself to be the most favourable. However, other methods are conceivable for connecting the wire conductor, which at first protrudes from the substrate 1 in the form of a loop 9, with the terminal area 6 concerned of the chip module 5.

Figure 11:
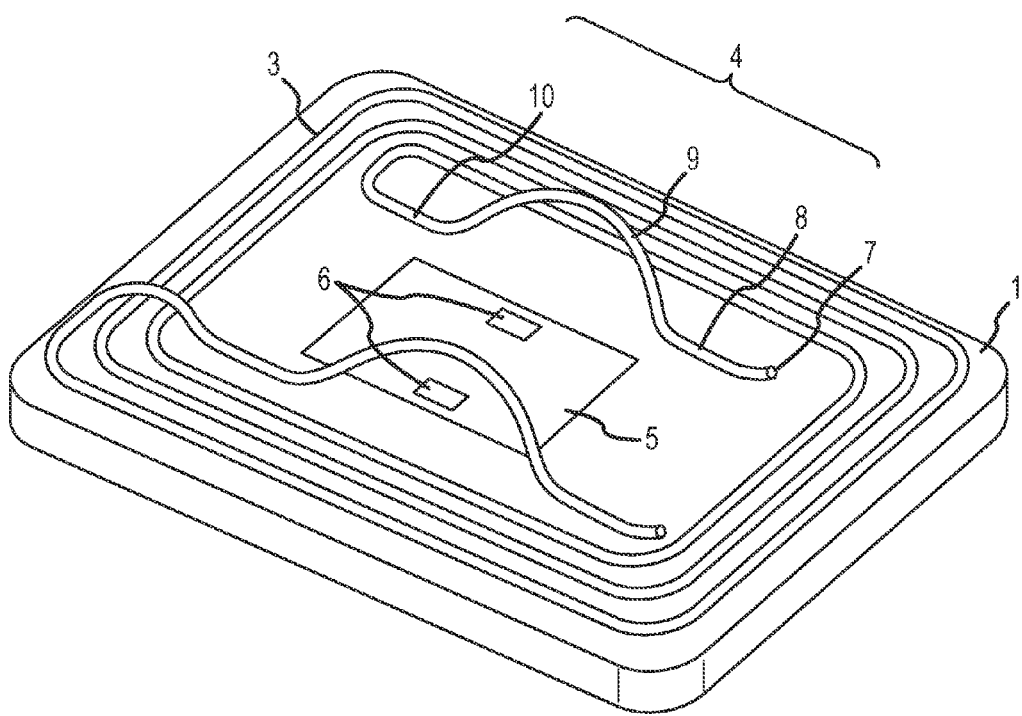
FIG. 11 shows a different substrate after laying and before connecting the wire conductor

Such an alternative method, for example, starts with a substrate on which the wire conductor has been laid before in the manner illustrated by FIG. 11—instead, however, one could also conceive of a substrate on which the wire conductor is laid as shown in FIG. 4 or 4a.

Figure 12:
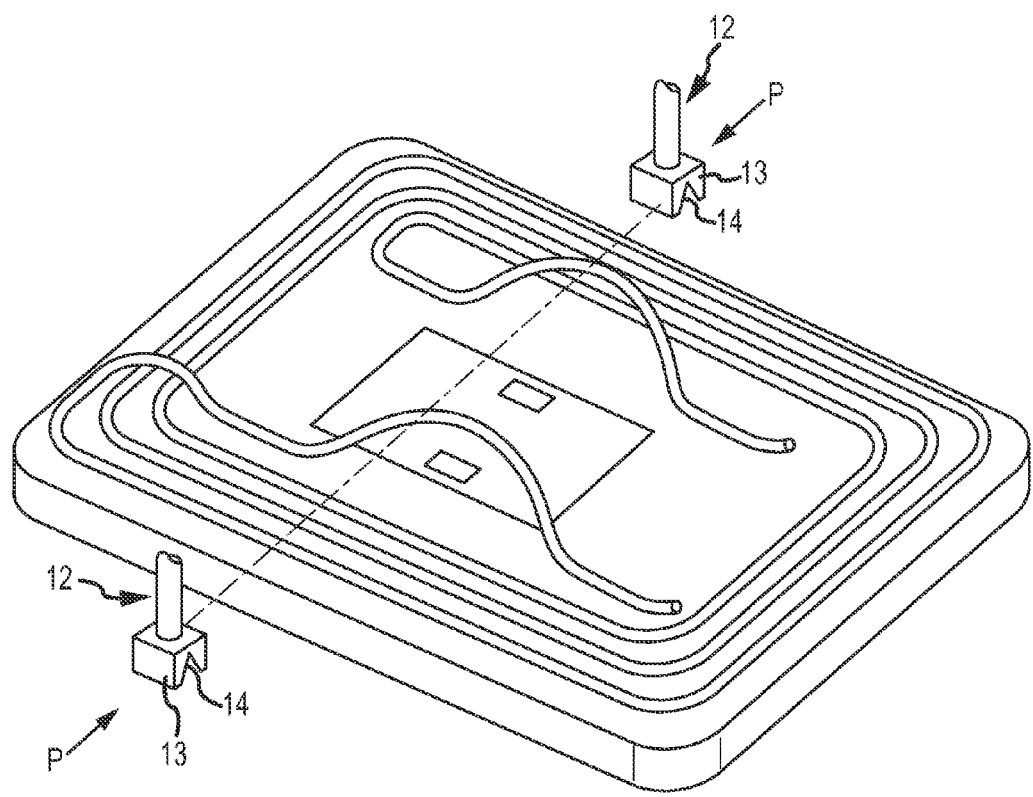
FIG. 12 shows how the grippers are guided towards the loops in another embodiment
Figure 13E:
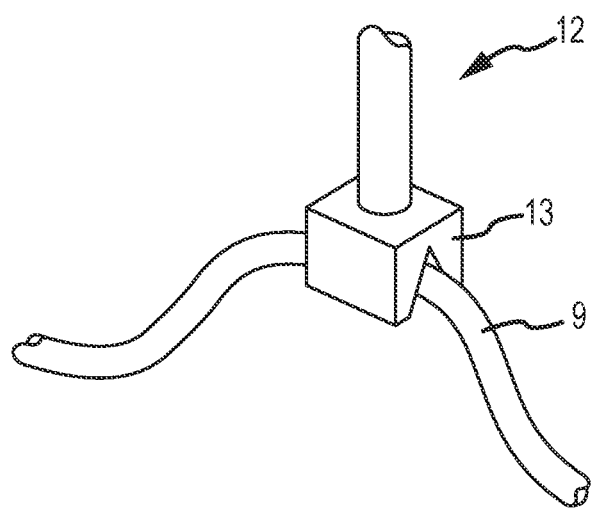

Once again, the wire connecting station is equipped with a digital image processing system (not shown in the drawing). This works as was already described above. A specially formed wire connecting head 12 or another tool for connecting the wire conductor with the chip module is brought close to every loop 9 with the help of this image processing system (FIG. 12). Bonding is most preferably used.

The FIGS. 13a to e illustrate how a suitable wire connecting head 12 may look and work. The wire connecting head 12 shown by FIGS. 13a to d as an example is designed as an ultrasonic bonding head. In a comparable form, however, it may also be used for gripping and pressing-against-the-terminal-area of the wire conductor, where it is then welded or glued by means of an additional device instead of ultrasonic bonding.

The wire connecting head 12 has a section 13 that, here, is designed like a block (compare also FIG. 12), which works as a wire gripper. To this end, the block-like section 13 is provided with a centring notch 14, which, here, has the design of a downwardly open V. The oblique surfaces of the centring notch 14 are tooled very smoothly, so that the wire conductor of the loop 9 glides on the oblique surfaces almost without friction. An air intake leads into the bottom of the centring notch 14, here in the form of several intake bores 15 lying one behind the other. They generate a perceptible suction directed into the centring notch. 14, as illustrated in FIG. 13a by a number of thin arrows. Since the work piece has been transferred rather precisely from the wire laying station to the wire connecting station and deposited there, the position of the loops 9 is known for the most part, even if not to $1/100$ mm. Therefore, possibly with the help of a digital image processing system, it is not a problem to guide the wire connecting head 12, in a well aimed manner, so close to the loop 9 allocated to it that the centring notch 14 comes so close to the loop 9 that the suction captures the appropriate section of the loop 9 and draws the wire conductor into the notch base of the centring notch 14 in the manner illustrated in FIG. 6b. The wire conductor now runs along the notch base, i.e. the loop 9 is now held gripped by the wire connecting head in the approximate manner illustrated by FIG. 13.

Since the wire conductor sucked into the centring notch 14 assumes a precisely defined position in relation to the wire connecting head 12, the wire connecting head is now brought exactly over the terminal area 6 of the chip so that the loop 9 is folded over to the side and the wire conductor located in the centring notch stands exactly above the terminal area 6 of the chip 5. Since the centring notch 14 is substantially bigger or deeper than the wire diameter in this embodiment, the wire conductor is now pressed downwards for the last part, against the terminal area 6, by the plunger 16 (through which suction is produced here at the same time, which, however, is not necessarily the case) which is guided to be vertically movable in the wire connecting head 12. Now, ultrasound is applied to the plunger whereby the wire conductor is welded to the terminal area 6.

Figure 14:
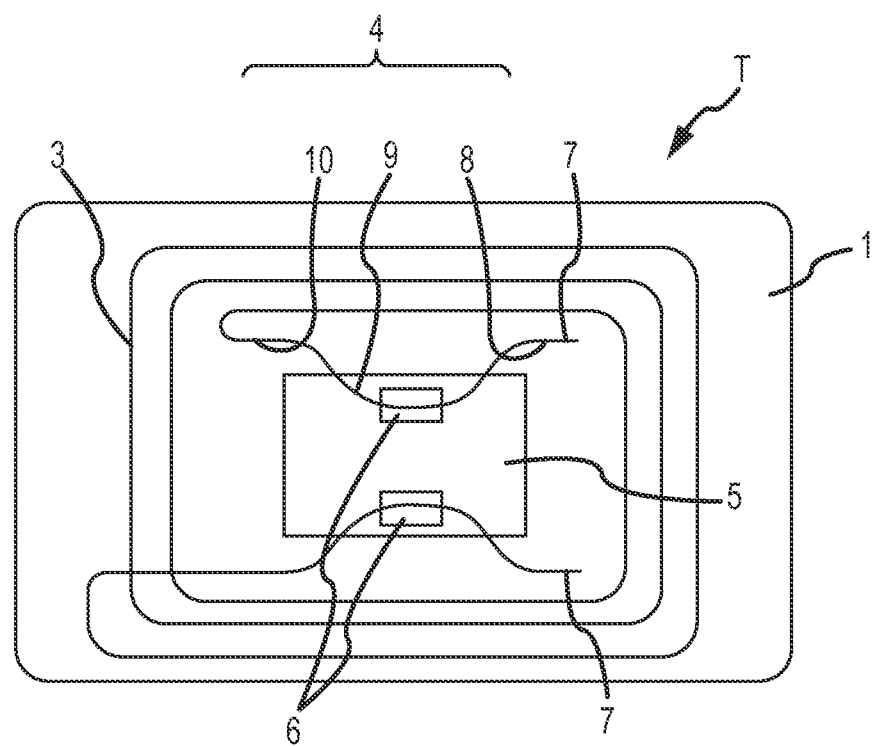
FIG. 14 shows a finished transponder unit produced in accordance with a second variant of the method.

In this way, for example, a finished transponder unit as FIG. 14 shows it is created from the work piece shown by FIG. 11.

One advantage of the method according to embodiments of the invention becomes visible in light of what is described above (for all variants)—practically, it does not matter what the location or position tolerances are that the chip module is subject to relative to the card substrate 1 it is received by. Because the accuracy with which the wire connecting head 12 aligns the wire conductor of the loop 9 with the terminal area 6 is almost independent from the position in which the chip module 5 came to lie relative to the card substrate 1 in the processing station concerned. Because such tolerances are compensated by the free areas of the loop not attached to the substrate, which in a large range make a free movement of that area of the wire conductor possible that in the end is aligned with the terminal area.

Figure 15:
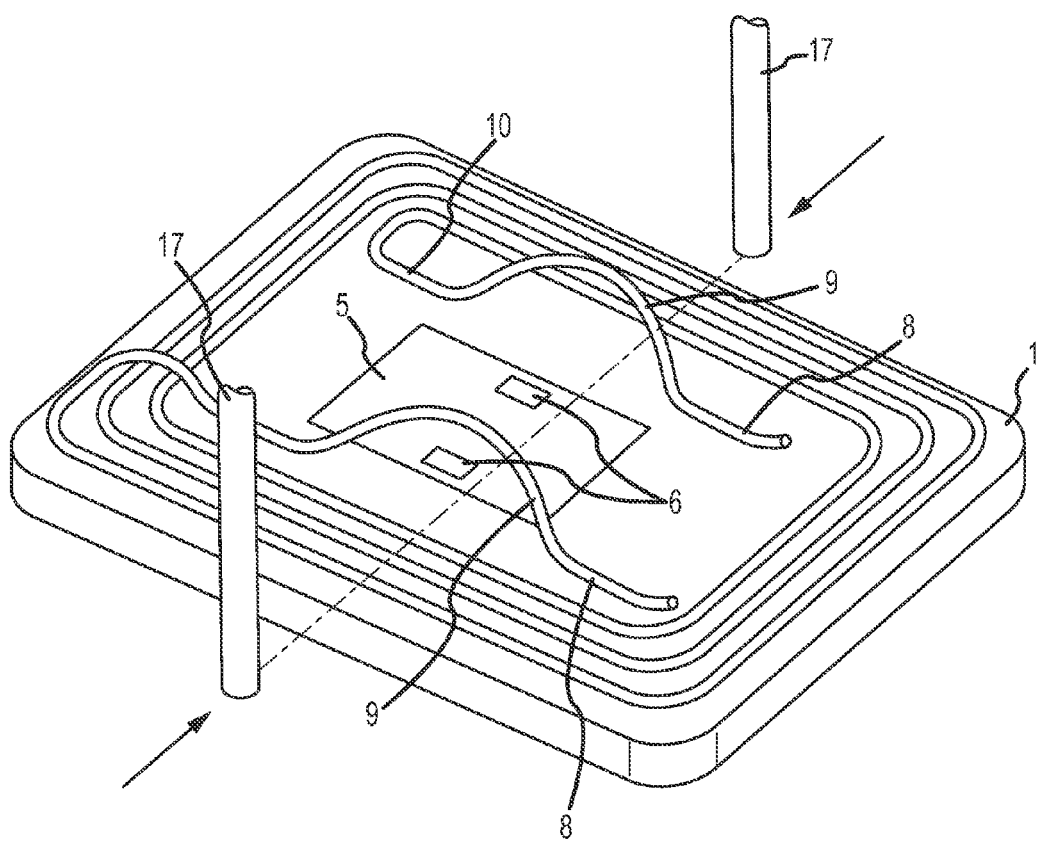
FIGS. 15 and 16 show a third variant of how the loops of the wire conductor can be bonded with the chip module.
Figure 16:
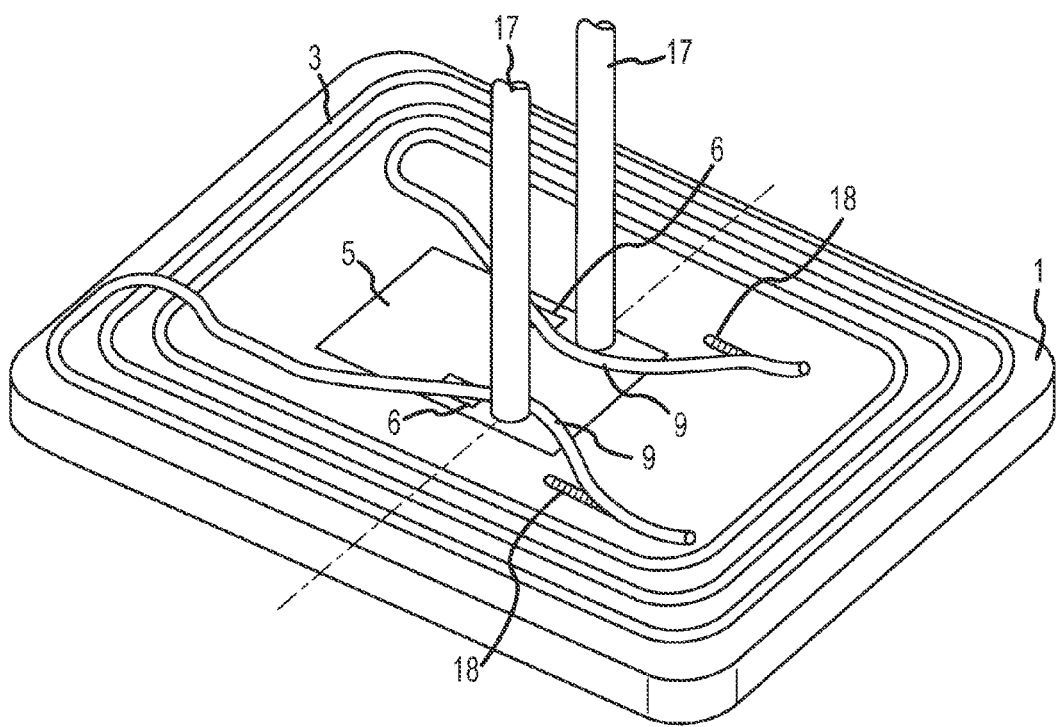

A third exemplary embodiment of the method according to the invention is shown in FIGS. 15 and 16. This substantially corresponds to the exemplary embodiments already described, so that what is described in this respect also applies to this third embodiment—if nothing else is described below.

In this third embodiment, two wire guiding pins 17 are used instead of the grippers 19a, 19b described above in connection with the other embodiments, or the wire connecting heads, which are designed also for gripping the wire. They are driven more or less parallel to the substrate surface towards the interior (FIG. 15). On their way, the wire guiding pins 17 inevitably capture the two loops 9, and lay them over in the direction of the terminal areas 6, as FIG. 14 shows schematically.

In the process, the wire guiding pins 17 are driven into the interior exactly to the extent that they draw a part of the wire conductor forming the loop 9 exactly above the associated terminal area 6 of the chip 5. It must be ensured that the wire conductor is drawn taut to a sufficient degree, but not ripped off. Preferably, this is achieved by the wire conductor forming the outer part 8 of the end portion 4 not having been laid in a fixed manner on the substrate 1. Instead, it was only tacked to the substrate, namely so loosely, that this outer part 8 of the wire conductor is pulled off or stripped off the substrate for a bit, while the part of the wire conductor forming the loop 9 is drawn in the above described manner over the terminal area 6 of the chip 5 by the wire guiding pin concerned, compare FIG. 16—reference numeral 18 there denotes the distance by which the outer part 8 of the wire conductor was stripped off the substrate again.

As an alternative to said re-stripping of the wire conductor, it is possible to firmly connect the wire conductor to the substrate everywhere, and to manufacture the position and length of the loops 9 to be so exact when laying the wire that the wire correctly lies on the terminal areas by itself, and is not drawn to taut, when the wire guiding pins are driven into the interior by a certain firmly set distance.

In any case, finally a wire conducting head not drawn in FIG. 16 is advanced from above, which intimately presses the wire conductor, which has come to lie on or with a certain distance above the respective terminal area 6 of the chip 5, against the terminal area 6 of the chip and connects it thereto in an electrically conductive manner, e.g., by means of the above-described ultrasonic bonding or alternatively by other welding or gluing techniques.

It applies to all embodiments that the processing steps described can of course be carried out in practice not only on a single substrate—rather, each of the processing stations consists of 8 to 20 handling systems working in parallel, each of which process a substrate synchronously.

Of course, not only transponder units for ID cards and passports can be manufactured with the method according to the invention, but also transponder units for almost any other purpose, such as access control cards, retail security systems, material flow control systems, etc.

LIST OF REFERENCE NUMERALS

1 Substrate
2 Wire conductor
3 Coil
4 End portion of the wire conductor
5 Chip module
6 Terminal areas of the chip
7 Free end of the wire conductor
8 Outer part of the end portion 4
9 Loop of the end portion 4
10 Inner part of the end portion 4
11 Wire laying head
12 Wire connecting head
13 block-like section functioning as wire gripper
14 Centering notch of the wire gripper
15 Intake bores
16 Ultrasound pressing rod
17 Wire guiding pin
18 Track which the wire conductor, which was tacked onto the substrate only loosely and was later stripped off the substrate, has left on the substrate

19*a* Gripper with high clamping force (gripper HI)
19*b* Gripper with low clamping force (gripper LO)
A1 Portion A1
A2 Portion A2
T Transponder unit

What is claimed is:

1. A method for bonding a wire conductor arranged on a substrate during the manufacture of a transponder unit having a wire coil and a chip module, comprising: in a first phase, permanently joining the coil with the substrate; and in a second phase, bonding the wire conductor to the chip module, wherein in the first phase at least one of the end portions of the wire conductor intended for later bonding with the chip module is attached to the substrate with a free loop being formed, and that the loop thus formed is gripped in a second phase and a section of the loop is then bonded with a terminal area of the chip module and attached to the terminal area in an electrically conductive manner and wherein in the second phase the loop is gripped by two grippers that take up a section of the loop between them and that are moved in such a manner, relative to the chip module and relative to each other, that said section of the loop finally at least substantially forms a straight line that covers a terminal area of a chip module.

2. The method according to claim 1, wherein the loop protrudes in such a way from the substrate that the loop can be gripped without the two grippers touching the substrate and the loop protrudes such that the plane in which the loop lies includes an angle of between 25 and 90 degrees with the substrate surface.

3. The method according to claim 1, wherein the loop is formed such in the first phase that the loop lies next to the chip module.

4. The method according to claim 3, wherein the loop is formed in a first phase such that the loop is followed by a section of wire conductor which is laid onto the substrate aligned in such a way that the imagined extension of said section of the wire conductor covers a terminal area of the chip module.

5. The method according to claim 1, wherein at least one of the two grippers applies a clamping force to the wire conductor; and wherein the clamping force is at least temporarily limited, namely in such a way that the wire conductor is pulled through said grippers in a gliding manner as soon as the wire conductor is subjected to tensile stress.

6. The method according to claim 5, wherein, subsequent to the gripping of the loop, the loop is pulled in such a way so that an end portion of the loop detaches from the substrate or tears open the loop and the end portion of the wire conductor exists as a free end.

7. The method according to claim 6, wherein the at least one gripper whose clamping force is limited is the gripper closest to the free end of the wire conductor.

8. The method according to claim 1, wherein the loop is dimensioned such that the loop can be tilted or folded onto the chip module in the direction of the substrate surface and hits the terminal area of the chip module allocated to the loop.

9. The method according to claim 1, wherein the method is carried out by two grippers which in the second phase grip a section of the loop, guide the gripped section to a terminal area of the chip module and then align the loop with the terminal area of the chip module.

10. The method according to claim 1, wherein at least one of the two grippers is a suction gripper adapted to suck the wire conductor of the loop into a centering device, which forces the wire conductor into a defined position, a location of which relative to the allocated terminal area of the chip module is known.

11. The method according to claim 10, wherein the at least one of the two grippers is provided with a pressure organ that is separately movable in relation to the at least one of the two grippers which presses the wire conductor out of a defined position at the at least one of the two grippers against the terminal area as soon as the at least one of the two grippers has positioned the wire conductor above the terminal area.

12. The method according to claim 11, wherein the pressure organ is coupled to an ultrasonic source for the purpose of ultrasonic friction welding.

13. The method according to claim 1, wherein the end portion of the wire conductor is drawn over the terminal area so that the wire conductor traverses the terminal area and is only then connected to the terminal area in an electrically conductive manner.

14. The method according to claim 1, wherein the first phase is carried out in a first processing station and the second phase in a second processing station which is spatially separated from the first processing station.

* * * * *